(12) United States Patent
Chu et al.

(10) Patent No.: US 7,466,767 B2
(45) Date of Patent: Dec. 16, 2008

(54) SIGNAL PROCESSING SYSTEM AND METHOD HAVING INCREASED BANDWIDTH

(75) Inventors: Jeffrey C. Chu, Los Altos, CA (US); Michael L. Downey, Fremont, CA (US)

(73) Assignee: Glowlink Communications Technology, Inc., Los Altos, CA (US)

( * ) Notice: Subject to any disclaimer, the term of this patent is extended or adjusted under 35 U.S.C. 154(b) by 540 days.

(21) Appl. No.: 10/940,287

(22) Filed: Sep. 13, 2004

(65) Prior Publication Data

US 2006/0056545 A1    Mar. 16, 2006

(51) Int. Cl.
*H03D 1/24*    (2006.01)
(52) U.S. Cl. .................................... 375/321
(58) Field of Classification Search ........... 375/316, 375/321, 324, 328, 242; 341/155; 455/131, 455/323, 307, 318, 266, 303
See application file for complete search history.

(56) References Cited

U.S. PATENT DOCUMENTS 5,392,044 A * 2/1995 Kotzin et al. ............... 341/155
5,412,690 A * 5/1995 Kotzin et al. ............... 375/256
5,659,546 A * 8/1997 Elder ........................ 370/343

* cited by examiner

*Primary Examiner*—Sam K Ahn
(74) *Attorney, Agent, or Firm*—Westberg Law Offices

(57) ABSTRACT

The invention is a signal processing system and method having increased bandwidth. An embodiment of the invention is a method of processing an analog input signal. The analog input signal is split into a first set of signals. The first set of signals are filtered. The first set of signals are digitized to form a second set of signals. The second set of signals are filtered to form a third set of signals. The third set of signals are combined to form a combined signal by adding the signals in the third set signals together to form a digital version of the analog input signal.

36 Claims, 2 Drawing Sheets

Broadening of Processing Bandwidth Beyond A/D Limitations

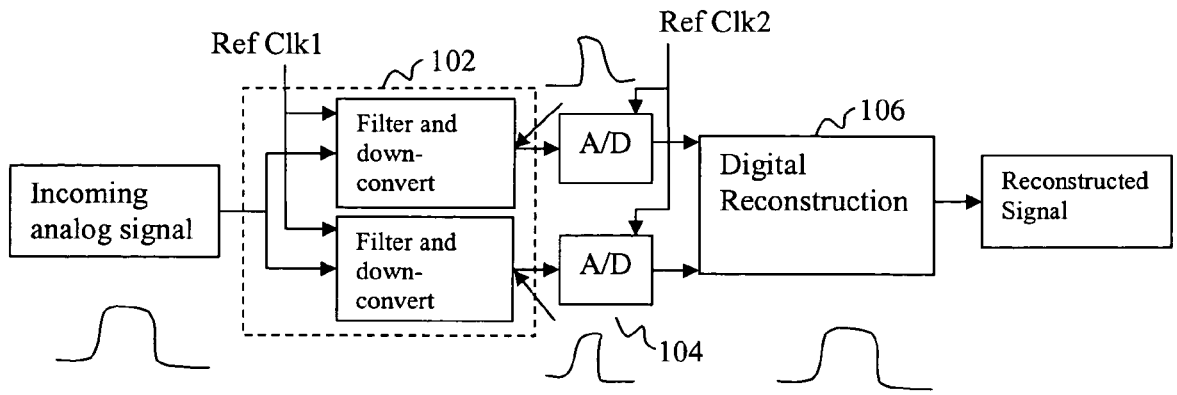
Figure 1. Broadening of Processing Bandwidth Beyond A/D Limitations
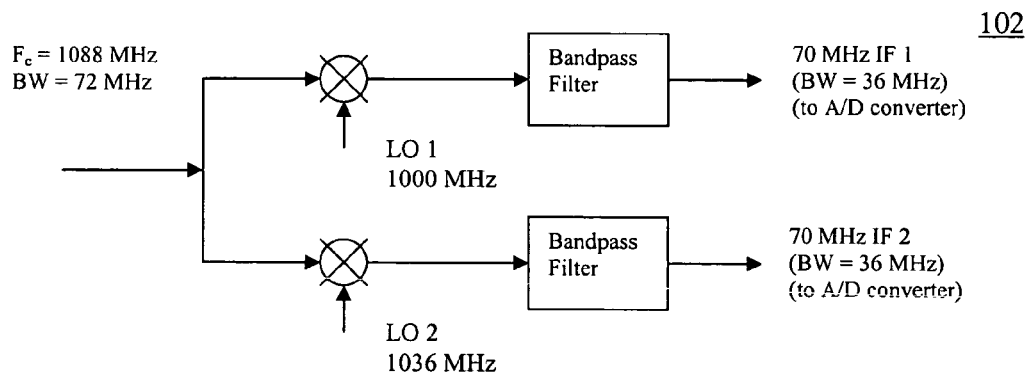
Figure 2. Filter and Down-convert Process Flow
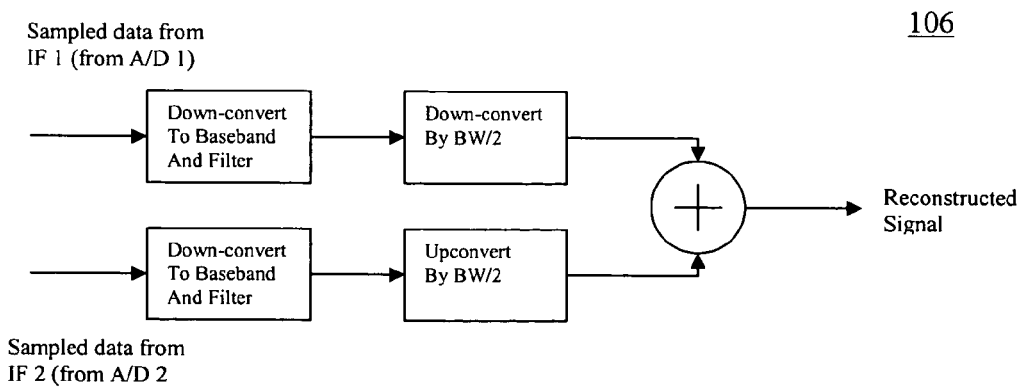
Figure 3. Digital Reconstruction Flow

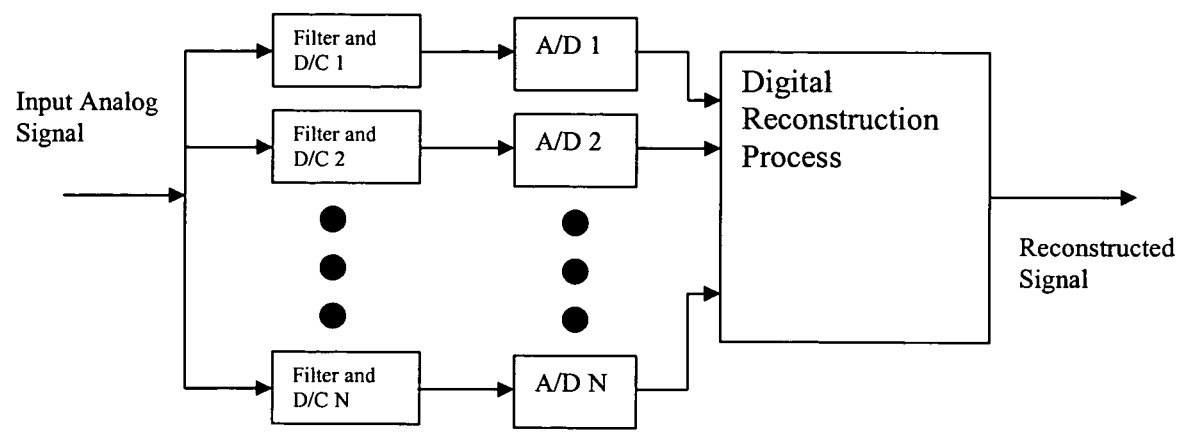
Figure 4. Generalized Approach using N paths

SIGNAL PROCESSING SYSTEM AND METHOD HAVING INCREASED BANDWIDTH

FIELD OF THE INVENTION

The present invention relates to the field of signal processing. In particular, it relates to increasing the instantaneous bandwidth of a signal processing system.

BACKGROUND OF THE INVENTION

Signals that can be processed to extract various parameters such as frequency, bandwidth, power, Eb/No, modulation parameters, in-band interferences, etc., are generally limited by a front-end analog-to-digital (A/D) converter, in that the bandwidth of the signals must be smaller than the converter's input bandwidth as well as the A/D sampling rate. This fundamental limitation is dictated by the Nyquist Theorem that states that the A/D sampling rate must be at least twice the signal bandwidth. Furthermore, the signal is also limited by the A/D input bandwidth, such that even if the sampling rate is sufficiently high, the input signal instantaneous bandwidth is still limited by the allowable input bandwidth of the A/D converter.

Therefore, what is needed is a way to increase bandwidth of a signal processing system.

SUMMARY OF THE INVENTION

The invention is a signal processing system and method having increased bandwidth. In an embodiment of the invention, a method of processing an analog input signal is provided. The analog input signal is split into a first set of signals. The first set of signals are filtered. The first set of signals are digitized to form a second set of signals. The second set of signals are filtered to form a third set of signals. The third set of signals are combined to form a combined signal by adding the signals in the third set signals together to form a digital version of the analog input signal.

The first set of signals may be filtered in a time-coherent manner. The first set of signals may be filtered so that each of the first set of signals may have a limited bandwidth and the center of the limited bandwidth of each of the first set of signals is different. The limited bandwidth of each of the first set of signals may be less than or equal to the input bandwidth and half the sampling frequency of a means for digitizing the secondary signal. The limited bandwidths of each of the first set of signals may not overlap. Filtering the first set of signals may comprise down-converting each of the first set of signals. The down-converting may be performed in a time coherent manner. The down-converting may be performed by mixing each of the first set of signals with a corresponding one of a set of local oscillator signals, wherein the local oscillator signals each have a different frequency, and the local oscillator signals are generated using one clock signal. Digitizing the first set of signals may be performed in a time-coherent manner. Combining the third set of signals may include filtering and adding together the third set of signals. Combining the third set of signals may include down-converting the third set of signals to a known frequency location, filtering the third set of signals to band limit their signal energies, selectively up-converting or down-converting each of the third set of signals to a respective frequency position and adding the third set of signals together. The known frequency location may be a base-band frequency of the analog input signal. The respective frequency positions may be adjacent and nonoverlapping.

These and other embodiments of the invention are described in more detail herein.

BRIEF DESCRIPTION OF THE DRAWINGS

FIG. 1 illustrates a block diagram of an embodiment of a signal processing system in accordance with an embodiment of the present invention;

FIG. 2 illustrates a block diagram of a filter and down-conversion process in accordance with an embodiment of the present invention;

FIG. 3 illustrates a block diagram of digital reconstruction process in accordance with an embodiment of the present invention; and FIG. 4 illustrates a block diagram of a signal processing system in accordance with an alternate embodiment of the present invention.

DETAILED DESCRIPTION OF A PREFERRED EMBODIMENT

We have developed a novel approach for increasing the instantaneous bandwidth of a signal processing system beyond that allowable by a front-end A/D converter, so that signals whose bandwidths are wider than the limits of the A/D converter can be processed to extract signal parameters including but not limited to frequency, bandwidth, power, Eb/No, modulation type, coding type and in-band interferences.

FIG. 1 illustrates a signal processing system in accordance with an embodiment of the invention. Our approach is comprised of three parts. First, it uses a signal filtering and down-conversion process in a filtering and down-converting stage 104 whereby an input signal is split-converted and output as two time-coherent signals, with an upper side band of the signal being converted and output as a signal centered on a given intermediate frequency (IF) via one signal path, and a lower side band being converted and output as a signal centered on the same IF but via a separate, time-coherent signal path. Second, the two IF signals are fed through two time-coherent A/D conversion paths 104 and digitized. Third, the two digitized signals are digitally reconstructed to form the original signal in a digital reconstruction stage 106.

An incoming analog signal may have a bandwidth that is wider than the bandwidth that an A/D converter can accommodate due to an input bandwidth limitation and a sampling rate limitation of the A/D converter. The analog signal is coherently filtered and down-converted into two signal paths. These signal paths are then run time coherently along two A/D conversion signal paths. The digital data streams may then be digitally combined and processed to yield the desired signal parameters.

Filter and Down-Convert Stage

FIG. 2 shows an example of the filtering and down-converting stage 104. The values used in the example are simply for illustration purposes and are not meant to limit the scope of the present invention; many different combinations are possible. As shown in FIG. 2, the original input signal is split into two separate paths. The signal may be split with a standard power divider. The split signals are then down-converted separately, in a time-coherent manner, using two different local oscillator (LO) frequencies. The LO frequencies may be offset by half the total desired signal bandwidth. The LO frequencies are made time-coherent by using one clock to generate both LO frequencies. Thus, referring to FIGS. 1 and 2, the exemplary LO frequencies of 1000 MHz and 1036 MHz are derived from ref clk1. The clock may produce a signal which is then multiplied by a first number to produce a first LO frequency, and a second number to produce a second LO frequency. The resulting two down-converted split signals are then filtered and output on the same intermediate frequency (IF). However, it is not necessary for the operation of the present invention for the down-converted split signals to be converted to the same IF. Further, the bandpass filters may be placed before and/or after the split signals are down-converted. Bandpass filters placed after the split signals are down-converted may be identical. A bandpass filter may also be used before the split signals are formed.

A/D Conversion

The two down-converted split signals are then converted to two sampled data streams by two A/D converters 104. A single clock is used to synchronize the two A/D converters. As shown in FIG. 1 this clock is ref clk2. The two A/D converters may be included on a single device. The bandwidth of each down-converted split signal is preferably less than or equal to the input bandwidth of the A/D converters and less than or equal to half the sampling rate of the A/D converters.

Digital Reconstruction Stage

FIG. 3 shows an example of the digital reconstruction stage 106. A quadrature down-conversion process is applied to each stream to bring it to baseband (e.g., centered at 0 Hz and the signal extends from −BW/2 to +BW/2). Each component is then digitally filtered, shifted to an appropriate frequency position and then added. The filtered digital data streams are then combined by adding them together in the time domain. Preferably each digital data stream will only contain the frequency components of interest. Furthermore, these frequency components should not overlap with the frequency components of the other stream(s).

One example of how this might be done is to digitally down-convert the digital data streams to a known frequency location, such as a base-band frequency of the original signal. The digital data streams may then be filtered to band limit the signal energy to BW/2, where BW/2 represents one-half of the original signal's bandwidth. The two streams represent in-phase and quadrature signal components. Next, the filtered data streams are up-converted or down-converted to their proper frequency position, phase-shifting the signals, and then the signals are coherently added. This combines the in-phase and quadrature components.

The resulting combined signal may then be further processed using conventional signal processing techniques to extract various parameters such as frequency, bandwidth, power, Eb/No, modulation parameters, in-band interferences, etc.

Generalized Approach

Although the examples shown thus far are for two processing paths, this technique can be generalized for N processing paths. The block diagram shown in FIG. 1, can be readily extended to N processing paths as shown in FIG. 4.

As shown in FIG. 4, this approach can be used to achieve N times the instantaneous bandwidth that is achievable with a single A/D converter. As an example, an input signal is 200 MHz wide and that each A/D converter provides 50 MHz of instantaneous bandwidth. By setting N=4, this process allows the reconstruction of the original 200 MHz signal using A/D's with only 50 MHz of bandwidth.

The invention utilizes the approaches described above to increase the bandwidth of a signal that can be processed by a digital signal processing system. Thus, the invention increases the instantaneous bandwidth of a digital signal processing system so that wider bandwidth signals can be processed than that permitted by the front-end analog-to-digital converters in a digital signal processing system.

The invention overcomes the fundamental limitation of an A/D converter by making it possible to process wider-bandwidth signals than is allowable by the practical and theoretical limits of the A/D, thus vastly opening up the signals that can be processed with a given A/D.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing form the spirit and scope of the invention.

What is claimed is:

1. A method of increasing instantaneous bandwidth of a signal processing system comprising:
   splitting an analog input signal received by the signal processing system into a first set of signals, the input signal having a bandwidth;
   filtering and downconverting each of the first set of signals such that the entire bandwidth of the input signal is divided into portions and each of the first set of signals contains a corresponding portion of the bandwidth of the analog input signal;
   digitizing the first set of signals to form a second set of signals, each of the second set of signals containing the corresponding portion of the bandwidth of the analog input signal;
   filtering the second set of signals to form a third set of signals; and
   combining the third set of signals to form a processed digital version of the analog input signal having the bandwidth of the analog input signal, said combining comprising down-converting the third set of signals to a known frequency location, filtering the third set of signals to band limit their signal energies, selectively up-converting or down-converting each of the third set of signals to a respective frequency position and adding the signals in the third set signals together.

2. The method of claim 1, wherein said filtering the first set of signals is performed in a time-coherent manner.

3. The method of claim 1, wherein said filtering the first set of signals is performed so that each of the first set of signals has a limited bandwidth and the center of the limited bandwidth of each of the first set of signals is different.

4. The method of claim 3, wherein the limited bandwidth of each of the first set of signals is less than or equal to half the sampling frequency of a means for digitizing the second set of signals.

5. The method of claim 1, wherein said down-converting is performed in a time coherent manner.

6. The method of claim 1, wherein the down-converting is performed by mixing each of the first set of signals with a corresponding one of a set of local oscillator signals, wherein the local oscillator signals each have a different frequency; and the local oscillator signals are generated using one clock signal.

7. The method of claim 1, wherein said digitizing the first set of signals is performed in a time-coherent manner.

8. The method of claim 1, wherein the known frequency location is a base-band frequency of the analog input signal.

9. The method of claim 1, wherein the respective frequency positions are adjacent and nonoverlapping.

10. The method of claim 1, wherein the first, second and third set of signals each comprise two signals.

11. The method of claim 1, wherein the first, second and third set of signals each comprise more than two signals.

12. The method of claim 1, wherein the bandwidth of the input signal is divided into equal fractions and each of the first set of signals contains a corresponding fraction of the bandwidth of the analog input signal.

13. A signal processing system comprising:
   a splitter for splitting an analog input signal into a first set of signals, the input signal having a bandwidth;
   a filtering and downconverting stage for filtering and downconverting the first set of signals such that the entire bandwidth of the input signal is divided into portions and each of the first set of signals contains a corresponding portion of the bandwidth of the analog bandwidth signal;
   analog-to-digital converters, one for each of the first set of signals, for forming digitized signals from the first set of signals, each of the digitized signals containing the corresponding portion of the bandwidth of the analog input signal; and
   a digital reconstruction stage for forming a processed digital version of the analog input signal, the processed digital version of the analog signal having the bandwidth of the analog input signal, wherein the reconstruction stage comprises means for down-converting the digitized signals to a known frequency location, filtering the digitized signals to band limit their signal energies, selectively up-converting or down-converting each of the digitized signals to a respective frequency position and adding the digitized signals together.

14. The system of claim 13, wherein the filtering and down-converting stage filters the first set of signals in a time-coherent manner.

15. The system of claim 13, wherein the filtering and down-converting stage filters the first set of signals so that each of the first set of signals has a limited bandwidth and the center of the limited bandwidth of each of the first set of signals is different.

16. The system of claim 15, wherein the limited bandwidth of each of the first set of signals is less than or equal to half the sampling frequency of the analog-to-digital converters.

17. The system of claim 13, wherein the filtering and down-converting stage further comprises a down-converter for down-converting each of the first set of signals.

18. The system of claim 17, wherein the down-converter performs the down-converting in a time coherent manner.

19. The system of claim 17, wherein the down-converter includes a mixer for mixing each of the first set of signals with a corresponding one of a set of local oscillator signals, wherein the local oscillator signals each have a different frequency; and the local oscillator signals are generated from the same clock signal.

20. The system of claim 13, wherein the analog-to-digital converter digitizes the first set of signals in a time-coherent manner.

21. The system of claim 13, wherein the digital reconstruction stage includes a combiner for adding together the digitized signals.

22. The system of claim 13, wherein the known frequency location is a base-band frequency of the analog input signal.

23. The system of claim 13, wherein the respective frequency positions are adjacent and nonoverlapping.

24. The system of claim 13, wherein the first set of signals and the digitized signals each comprise two signals.

25. The system of claim 13, wherein the first set of signals and the digitized set of signals each comprise more than two signals.

26. The system of claim 13, wherein the bandwidth of the input signal is divided into equal fractions and each of the first set of signals contains a corresponding fraction of the bandwidth of the analog input signal.

27. A method of increasing instantaneous bandwidth of a processing system comprising:
   splitting an analog input signal received by the signal processing system into a first set of signals;
   filtering the first set of signals;
   digitizing the first set of signals to form a second set of signals;
   filtering the second set of signals to form a third set of signals; and
   combining the third set of signals to form a processed digital version of the analog input signal, said combining comprising down-converting the third set of signals to a known frequency location, filtering the third set of signals to band limit their signal energies, selectively up-converting or down-converting each of the third set of signals to a respective frequency position and adding the third set of signals together.

28. The method of claim 27, wherein the known frequency location is a base-band frequency of the analog input signal.

29. The method of claim 27, wherein the respective frequency positions are adjacent and nonoverlapping.

30. The method of claim 27, wherein the entire bandwidth of the input signal is divided into portions and each of the first set of signals contains a corresponding portion of the bandwidth of the analog input signal.

31. The method of claim 27, wherein the bandwidth of the input signal is divided into equal fractions and each of the first set of signals contains a corresponding fraction of the bandwidth of the analog input signal.

32. A signal processing system comprising:
   a splitter for splitting an analog input signal into a first set of signals;
   a filtering and downconverting stage for filtering and downconverting the first set of signals;
   analog-to-digital converters, one for each of the first set of signals, for forming digitized signals; and
   a digital reconstruction stage for transforming the digitized set of signals, wherein the reconstruction stage comprises means for down-converting the digitized signals to a known frequency location, filtering the digitized signals to band limit their signal energies, selectively up-converting or down-converting each of the digitized signals to a respective frequency position and combining the digitized signals together.

33. The system of claim 32, wherein the known frequency location is a base-band frequency of the analog input signal.

34. The system of claim 32, wherein the respective frequency positions are adjacent and nonoverlapping.

35. The system of claim 32, wherein the entire bandwidth of the input signal is divided into portions and each of the first set of signals contains a corresponding portion of the bandwidth of the analog input signal.

36. The system of claim 32, wherein the bandwidth of the input signal is divided into equal fractions and each of the first set of signals contains a corresponding fraction of the bandwidth of the analog input signal.

* * * * *

UNITED STATES PATENT AND TRADEMARK OFFICE
CERTIFICATE OF CORRECTION

PATENT NO. : 7,466,767 B2  Page 1 of 1
APPLICATION NO. : 10/940287
DATED : December 16, 2008
INVENTOR(S) : Chu et al.

It is certified that error appears in the above-identified patent and that said Letters Patent is hereby corrected as shown below:

Column 4, line 43, the phrase "set signals" should read --set of signals--;
Column 4, line 60, the phrase "using one" should read --from the same--;
Column 5, lines 16-17, the phrase "bandwidth signal" should read --input signal--; and
Column 6, lines 8-9, the phrase "a processing system" should read --a signal processing system--.

Signed and Sealed this

Fifth Day of May, 2009

JOHN DOLL
*Acting Director of the United States Patent and Trademark Office*